(12) United States Patent
Ueda

(10) Patent No.: US 6,569,776 B2
(45) Date of Patent: May 27, 2003

(54) METHOD OF REMOVING SILICON NITRIDE FILM FORMED ON A SURFACE OF A MATERIAL WITH A PROCESS GAS CONTAINING A HIGHER-ORDER FLUOROCARBON IN COMBINATION WITH A LOWER-ORDER FLUOROCARBON

(75) Inventor: Yasuhiko Ueda, Minato-ku (JP)

(73) Assignees: NEC Electronics Corporation, Kanagawa (JP); Hitachi, Ltd., Tokyo (JP); NEC Corporation, Tokyo (JP)

( * ) Notice: Subject to any disclaimer, the term of this patent is extended or adjusted under 35 U.S.C. 154(b) by 0 days.

(21) Appl. No.: 10/124,398

(22) Filed: Apr. 18, 2002

(65) Prior Publication Data

US 2002/0155726 A1 Oct. 24, 2002

(30) Foreign Application Priority Data

Apr. 23, 2001 (JP) ........................ 2001-124259

(51) Int. Cl.$^7$ .............................................. H01L 21/28
(52) U.S. Cl. ...................................................... 438/724
(58) Field of Search .................................. 438/706, 724

(56) References Cited

U.S. PATENT DOCUMENTS

| | | | | |
|---|---|---|---|---|
| 4,529,476 A | * | 7/1985 | Kawamoto et al. | ......... 156/643 |
| 4,857,140 A | * | 8/1989 | Loewenstein | .............. 156/643 |
| 5,176,790 A | * | 1/1993 | Arleo et al. | ................. 156/643 |
| 6,010,968 A | * | 1/2000 | Yang et al. | .................. 438/719 |
| 6,051,504 A | * | 4/2000 | Armacost et al. | ........... 438/706 |
| 6,069,087 A | * | 5/2000 | Keller et al. | ................. 438/706 |
| 6,074,952 A | * | 6/2000 | Liu et al. | ..................... 438/706 |
| 6,080,662 A | * | 6/2000 | Chen et al. | .................. 438/637 |
| 6,362,109 B1 | * | 3/2002 | Kim et al. | ................... 438/706 |
| 2001/0041450 A | * | 10/1998 | Matsumoto et al. | ........ 438/710 |

FOREIGN PATENT DOCUMENTS

| | | |
|---|---|---|
| JP | 9-293689 A | 11/1997 |
| JP | 10-12747 A | 1/1998 |
| JP | 2000-12856 A | 1/2000 |

* cited by examiner

*Primary Examiner*—Richard Elms
*Assistant Examiner*—Beth E. Owens
(74) *Attorney, Agent, or Firm*—Sughrue Mion, PLLC

(57) ABSTRACT

For selectively removing a silicon nitride film formed on a bottom of a contact hole or the like in a semiconductor device, plasma etching is performed using a process gas supplied therefor which is comprised of a first fluorine compound including a carbon atom-carbon atom bond [for example, octafluorocyclobutane ($C_4F_8$), hexafluorobutadiene ($C_4F_6$), octafluorocyclopentene ($C_5F_8$)], and a second fluorine compound including at least one hydrogen atom and a single carbon atom in one molecule (for example, fluoromethane ($CH_3F$), difluoromethane ($CH_2F_2$), trifluoromethane ($CHF_3$)]. According to this method, the silicon nitride film on the bottom can be selectively removed without removing a silicon nitride film formed on a side wall of the contact hole and the like.

10 Claims, 12 Drawing Sheets

METHOD OF REMOVING SILICON NITRIDE FILM FORMED ON A SURFACE OF A MATERIAL WITH A PROCESS GAS CONTAINING A HIGHER-ORDER FLUOROCARBON IN COMBINATION WITH A LOWER-ORDER FLUOROCARBON

BACKGROUND OF THE INVENTION

1. Field of the Invention

The present invention relates to a method of fabricating a semiconductor device, and more particularly, to a method of removing a silicon nitride film formed on the bottom of a contact hole and the like in fabrication of a semiconductor device.

2. Description of the Related Art

With the miniaturization in fabrication processes of semiconductor devices, the miniaturization is also under way in contact holes, via holes and the like formed through interlayer insulating films in semiconductor devices. Since interlayer insulating films cannot be reduced in thickness in concert with the progress of miniaturization in design rules, the aspect ratios of holes such as contact holes necessarily become larger. In addition, due to a requirement for reducing variations in alignment of contact holes with underlying wires and the like, associated with the miniaturization in the fabricating process, a self-aligned contact (SAC) process has drawn more and more attention because this process can eliminate a design margin for the alignment on a photomask.

While there are several SAC processes, a typical one involves forming a gate electrode and a gate wire, an offset oxide film disposed on the top faces of them, and side walls (oxide films) disposed on side faces of the gate electrode and gate wire, conformally forming a thin SiN (silicon nitride) film over the entire surface as an etching stopper film, subsequently forming an interlayer insulating film (oxide film), and selectively removing the interlayer insulating film at and near positions at which contact holes are to be formed through a photolithographic step. In this event, since the final positions of the contact holes are determined by the side walls and offset oxide film, this can be said a sort of self-aligned process. Finally, the SiN film is removed from the bottoms of the contact holes which are then filled with contact plugs.

Further, in the SAC process, an attempt has been made to use an SiN film instead of the offset oxide film formed on the gate electrode and gate wire, and to use an SiN film as well for the side walls.

Depending on a process which follows the formation of contact holes, the interlayer insulating film, which is an oxide film, can be damaged. For protecting the interlayer insulating film from such a damage, a thin SiN film may be formed on a side wall (inner wall) of a formed contact hole, for example, in thickness of 10 to 20 nm. In this case, the SiN film on the bottom of the contact hole must be removed after the SiN film is formed on the side wall of the contact hole. Particularly, the formation of such SiN film is deemed as essential when a relatively "soft" oxide such as BPSG (borophosphosilicate glass) is used as the interlayer insulating film.

FIG. 1 is a schematic cross-sectional view illustrating a contact hole before an SiN film is removed after the contact hole was formed. A pair of wiring patterns 12 or electrode patterns made of WSi (tungsten silicide) are formed on substrate 11 made of silicon or the like, and similarly patterned offset SiN films 13 are formed on wiring patterns 12. Further, side walls 14 similarly made of SiN are provided on side faces of wiring patterns 12 and offset SiN films 13. Then, interlayer insulating film 15 made of silicon oxide is formed over the entire surface of substrate 11 including wiring patterns 12, offset SiN films 13 and side walls 14. Interlayer insulating film 15 is formed with a contact hole 16 by an SAC process. Contact hole 16 extends through interlayer insulating film 15 to the surface of substrate 11 in a region sandwiched by the pair of wiring patterns 12.

Thin SiN film 17 is formed on the bottom and inner side face (side wall) of contact hole 16. Here, the bottom of contact hole 16 refers to a portion of the contact hole which is in contact with the surface of substrate 11. This SiN film 17 is provided as a film for protecting interlayer insulating film 15 from a wet etching and the like in subsequent processes. While SiN film 17 is also formed on the top face of interlayer insulating film 15 depending on its deposition process, the SiN film overlying interlayer insulating film 15 may be removed as required by a subsequent CMP (chemical mechanical polishing) process or the like. It should be noted that contact hole 16 formed by the SAC process is generally set such that its diameter on the top face of interlayer insulating film 15 is larger than that on the bottom of contact hole 16. Therefore, the diameter of contact hole 16 on the bottom thereof is determined by side walls 14 in a self-aligned manner, and shoulder 18 is formed within contact hole 16.

When contact hole 16 is used for interlayer connection, SiN film 17 must be removed from the bottom of contact hole 16, as described above, before contact hole 16 is filled with a wiring material or a wiring plug. In this event, since the SiN film on the side wall of contact hole 16 must be left, anisotropic etching is used. Such anisotropic etching may be dry etching such as plasma etching.

When the SiN film on the bottom of contact hole 16 is removed by plasma etching, a gas system conventionally used for this purpose is a gas system of $CHF_3/Ar/O_2$, a gas system of $CH_2F_2/Ar/O_2$, and the like. When the former gas system is used, an etching reaction is expressed by:

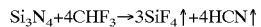

In this example, a product having a relatively high vapor pressure, such as $SiF_4$, HCN or the like is formed to promote the etching reaction. Likewise, with the latter gas system a product having a relatively high vapor pressure is produced such as $SiF_4$, HCN or the like.

However, the dry etching which uses the aforementioned conventional gas system has a problem in that the SIN film on the side face of the contact hole, as well as the SIN film on the bottom of the contact hole is inevitably etched to some degree. Since etching is less advanced as the aspect ratio is larger, in other words, since an upper portion of a contact hole, i.e., a region near the entrance of the contact hole is etched in advance, the etching rate at the shoulder 18 within the contact hole is higher than the etching rate on the bottom of the contact hole. In some cases, as illustrated in FIG. 2, an SiN film on side wall 14 has been etched away before the SIN film on the bottom of contact hole 16 is completely removed, causing wiring patterns 13 made of WSi to expose to contact hole 16. If contact hole 16 is embedded with a contact plug metal with exposed wiring patterns 13, the contact plug will be short-circuited with wiring patterns 13.

SUMMARY OF THE INVENTION

It is therefore an object of the present invention to provide a method of removing a silicon nitride (SiN) film which is capable of reliably removing an SiN film on the bottom of a contact hole without removing an SiN film formed on a side wall of the contact hole, even if the contact hole has a large aspect ratio.

The inventor diligently repeated investigations for achieving the above object, and as a result found that a silicon nitride film on the bottom of a hole such as a contact hole alone can be selectively removed by using a process gas which comprises a first fluorine compound including a carbon atom-carbon atom bond, and a second fluorine compound including at least one hydrogen atom and a single carbon atom in one molecule, thereby completing the present invention. Assume in the present invention that a double bond C=C and a triple bond C≡C also fall under the carbon atom-carbon atom bond, in addition to the single bond C—C. In the present invention, preferably used as the first fluorine compound may be, by way of example, octafluorocyclobutane ($C_4F_8$), hexafluorobutadiene ($C_4F_6$), octafluorocyclopentene ($C_5F_8$) and the like. On the other hand, preferably used as the second fluorine compound may be, by way of example, monofluoromethane ($CH_3F$), difluoromethane ($CH_2F_2$), trifluoromethane ($CHF_3$) and the like.

Specifically, a method of removing a silicon nitride film according to the present invention has an application in removal of a silicon nitride film formed on a surface of a material. The method includes the steps of supplying a process gas which comprises a first fluorine compound having fluorine atoms and at least two carbon atoms in one molecule, and a second fluorine compound having at least one fluorine atom, at least one hydrogen atom and a single carbon atom in one molecule, and performing dry etching using the process gas to remove the silicon nitride film.

In the following description, for facilitating the understanding the invention by comparison in terms of chemical structures, the first fluorine compound, i.e., a fluorine compound including a carbon atom-carbon atom bond may be called the "higher-order fluorocarbon" and the second fluorine compound, i.e., a fluorine compound including at least one hydrogen atom and a single carbon atom in one molecule, the "lower-order fluorocarbon."

Conventionally, higher-order fluorocarbons such as octafluorocyclobutane ($C_4F_8$), hexafluorobutadiene ($C_4F_6$), octafluorocyclopentene ($C_5F_8$) and the like have been used for etching silicon oxide films, particularly for removing a silicon oxide film formed on the bottom of a hole having a large aspect ratio, such as a contact hole. However, due to a low vapor pressure of a product obtained by a reaction with silicon nitride, and high probability of producing deposition, the higher-order fluorocarbons are deemed as substantially failing to provide etching performance for a silicon nitride film, so that the higher-order fluorocarbons have not been used for etching a silicon nitride film in any examples.

However, the inventor has found that a silicon nitride film alone can be selectively removed on the bottom of a hole such as a contact hole by using such a higher-order fluorocarbon in combination with a lower-order fluorocarbon such as fluoromethane ($CH_3F$), difluoromethane ($CH_2F_2$), trifluoromethane ($CHF_3$) or the like. The lower-order fluorocarbon is conventionally used for etching silicon nitride films. Specifically, the inventor has found that a silicon nitride film formed on the bottom of a contact hole or the like can be completely removed without etching a silicon nitride film formed on a side wall of the contact hole or the like by supplying a process gas including a higher-order fluorocarbon and a lower-order fluorocarbon, and performing dry etching using this process gas.

As a mechanism of the foregoing phenomenon, the inventor assumes a process as follows: As a higher-order fluorocarbon is decomposed within a plasma, $C_xF_y$ radicals, derived from the higher-order fluorocarbon, increase in the vapor phase. The $C_xF_y$ radicals, however, can be introduced a shallow distance into a hole, but not deep into the hole due to the adsorption characteristic thereof. On the other hand, radicals derived from a lower-order fluorocarbon is introduced deep into the hole to etch an SiN film. Thus, the bottom of the contact hole is etched by the radicals derived from the lower-order fluorocarbon, while a side wall and a shoulder of the contact hole are protected by an inverse micro-loading effect of the $C_xF_y$ radicals derived from the higher-order fluorocarbon. In this manner, the SiN film alone is selectively etched on the bottom of the hole. The inverse micro-loading effect, herein referred to, means that a location shallow in a hole is not etched but a location deep in the hole is etched.

The inventor further investigated a preferred ratio of the higher-order fluorocarbons (first fluorine compounds) to the lower-order fluorocarbons (second fluorine compounds) in a supplied process gas, and eventually found that the following relationship is preferably satisfied:

$$1 \leq R_1/R_2 \leq 4$$

where $R_1$ is the sum of $m_1 \times n_{C-C}$ calculated for the respective first fluorine compounds; $R_2$ is the sum of $m_2 \times n_{C-H}$ calculated for the respective second fluorine compounds; $n_{C-C}$ is the number of carbon atom-carbon atom bonds included in one molecule of each first fluorine compound; $m_1$ is a mole fraction of each first fluorine compound in the supplied process gas; $n_{C-H}$ is the number of carbon atom-hydrogen atom bonds included in one molecule of each second fluorine compound; and $m_2$ is a mole fraction of each second fluorine compound in the supplied process gas.

The method of removing a silicon nitride film according to the present invention is particularly suitable for removing a silicon nitride film formed on the bottom of a hole such as a contact hole formed in fabrication of a semiconductor device. Such a hole may be a hole, for example, having an aspect ratio in a range of three to ten.

The above and other objects, features, and advantages of the present invention will become apparent from the following description with reference to the accompanying drawings which illustrate examples of the present invention.

DETAILED DESCRIPTION OF THE INVENTION

Next, the present invention will be described in detail by discussing the removal of a silicon nitride film formed on the bottom of a hole such as a contact hole formed in fabrication of a semiconductor device.

Figure 1:
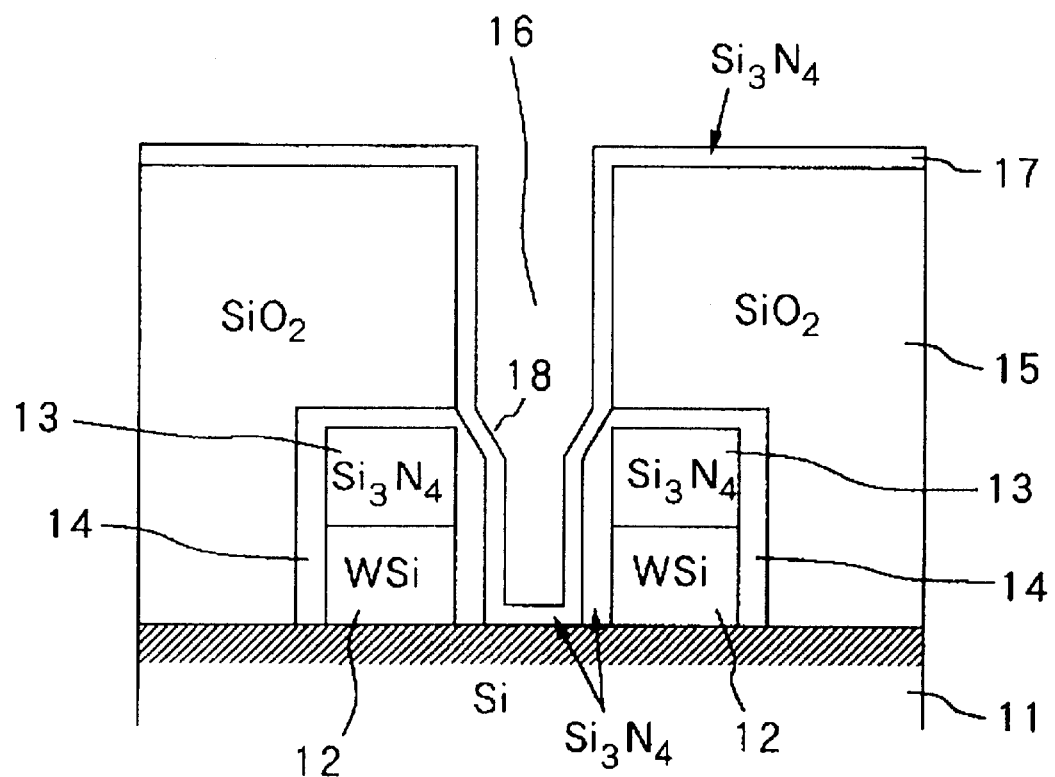
FIG. 1 is a schematic cross-sectional view illustrating a contact hole formed by an SAC (self-aligned contact) process.
Figure 2:
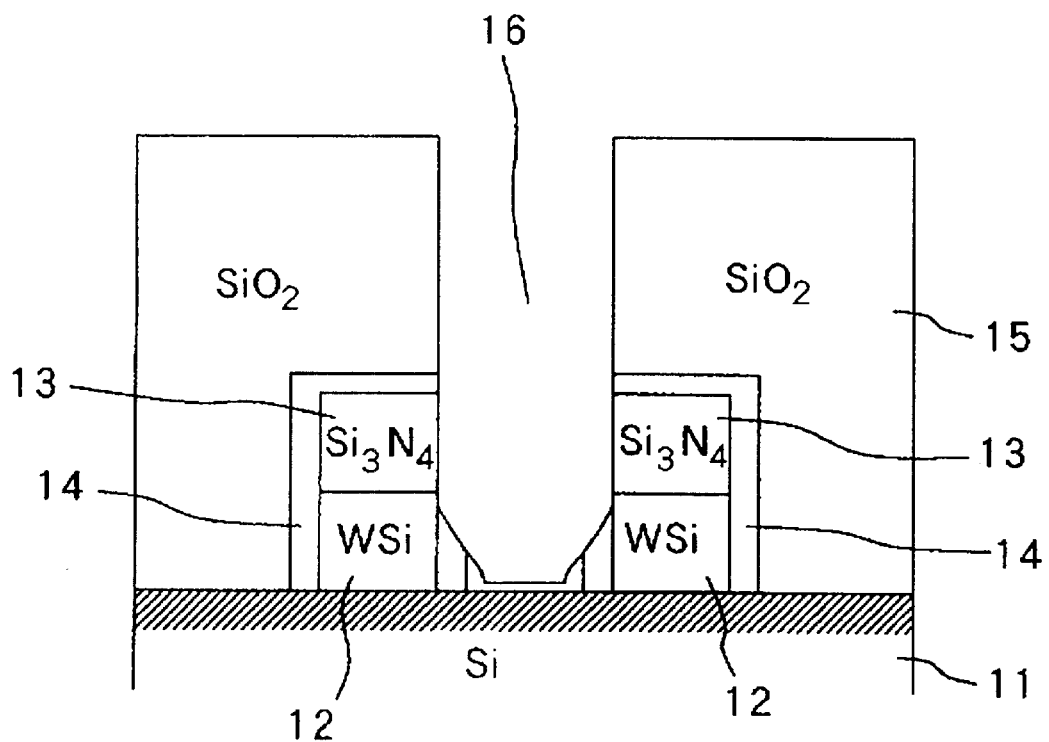
FIG. 2 is a schematic cross-sectional view illustrating a contact hole in which a silicon nitride film on a side wall is etched.

First, an interlayer insulating film is formed on a semiconductor substrate by a known semiconductor fabricating process, and a contact hole is formed by an SAC process. In this event, an SiN (silicon nitride) film may be previously formed at a position, at which the bottom of the contact hole is defined, for use as an etching stopper film when the contact hole is formed. Next, a thin SiN film is formed on an inner wall and bottom of the contact hole. The cross-sectional shape at this time is illustrated in the aforementioned FIG. 1.

Next, the semiconductor substrate formed with the contact hole in the foregoing manner is placed in a reaction chamber for performing plasma etching. A process gas is supplied into the reaction chamber after the reaction chamber is decompressed to a predetermined pressure. An RF (radio frequency) discharge is generated in the reaction chamber while adjusting the amount of the process gas supplied to the reaction chamber and the amount of gas exhausted from the reaction chamber to maintain a constant pressure within the reaction chamber, and the plasma etching is performed. A process gas used in this event is a mixture of a first fluorine compound having a carbon atom-carbon atom bond, for example, octafluorocyclobutane ($C_4F_8$), hexafluorobutadiene ($C_4F_6$), octafluorocyclopentene ($C_5F_8$) or the like, and a second fluorine compound including at least one hydrogen atom and a single carbon atom in one molecule, for example, monofluoromethane ($CH_3F$), difluoromethane ($CH_2F_2$), trifluoromethane ($CHF_3$) or the like. The process gas may additionally include gases such as argon (Ar), oxygen ($O_2$) and the like. The process gas is composed such that the sums $R_1$, $R_2$ satisfy the following relationship:

$$1 \leq R_1/R_2 \leq 4 \quad (1)$$

where $R_1$ is the sum of $m_1 \times n_{C-C}$ calculated for the respective first fluorine compounds; $R_2$ is the sum of $m_2 \times n_{C-H}$ calculated for the respective second fluorine compounds; $m_1$ is a mole fraction of each first fluorine compound in the supplied process gas; $m_2$ is a mole fraction of each second fluorine compound in the supplied process gas; $n_{C-C}$ is the number of carbon atom-carbon atom bonds (i.e., C—C, C=C and C≡C bonds) included in one molecule of each first fluorine compound; and $n_{C-H}$ is the number of carbon atom-hydrogen atom bonds (i.e., C—H bond) included in one molecule of each second fluorine compound.

Here, when the process gas is composed of one of the first fluorine compounds and one of the second fluorine compounds, the following relationship may be satisfied:

$$1 \leq m_1 \times n_{C-C}/(m_2 \times n_{C-H}) \leq 4$$

Of course, a plurality of the first fluorine compounds may be used in combination. Similarly, a plurality of the second fluorine compounds may be used in combination.

Figure 3:
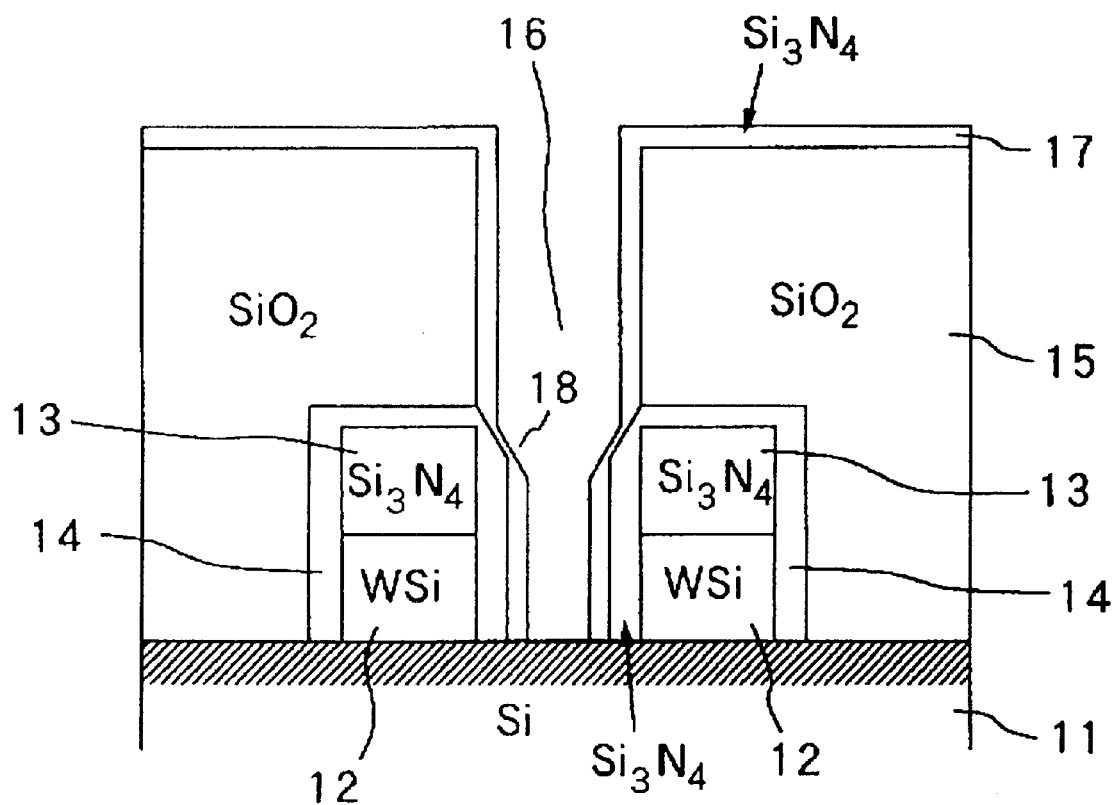
FIG. 3 is a schematic cross-sectional view illustrating a contact hole in which a silicon nitride film is etched in accordance with a method of the present invention.

When the plasma etching is performed under the foregoing condition, the silicon nitride film on the bottom of contact hole 16 is completely removed without etching the side wall of contact hole 16, as can be seen in the cross-sectional shape illustrated in FIG. 3. In this event, since shoulder 18 within contact hole 16 is positioned above the bottom of the hole, higher-order fluorocarbons adsorb on the surface of shoulder 18 to limit the etching rate.

EXAMPLES

In the following, the present invention will be described in greater detail in connection with examples.

EXAMPLE 1

Experiment For Confirming Basic Characteristics

Figure 4:
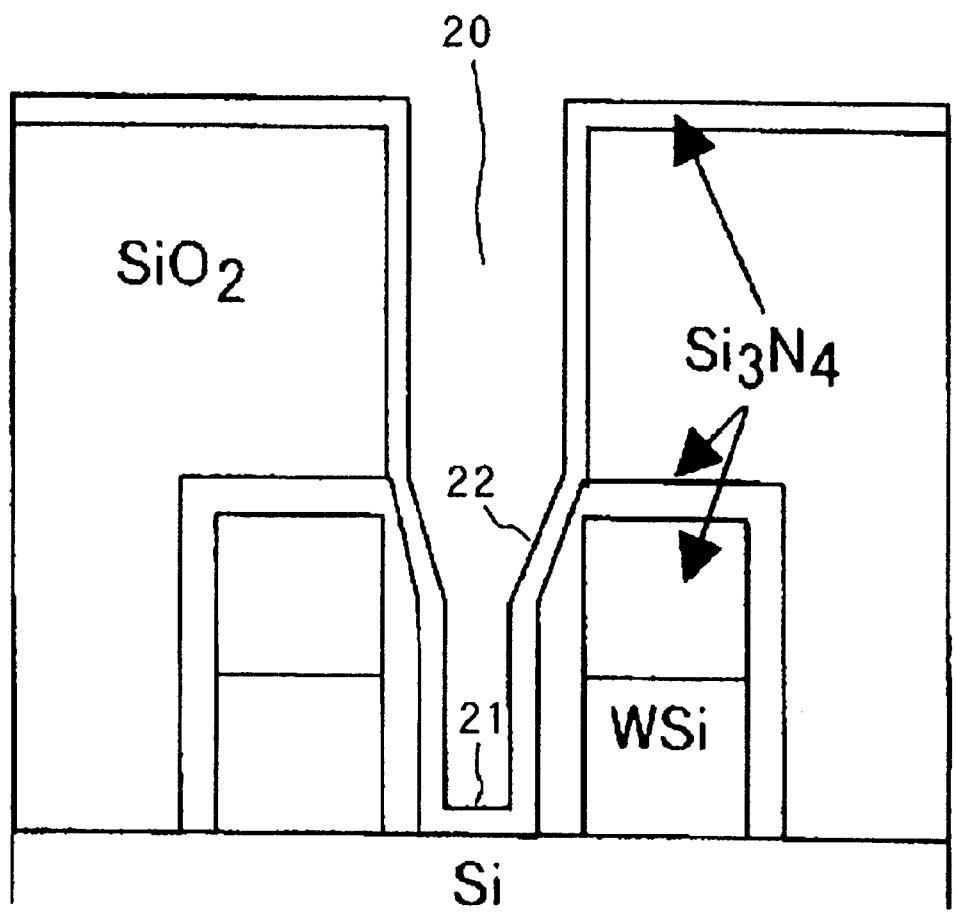
FIG. 4 is a schematic cross-sectional view illustrating the structure of a sample for evaluation in Example 1.

Samples for evaluation were provided as illustrated in FIG. 4, and an SiN film of the evaluation sample was etched, while varying the composition and flow rate of a process gas as listed below, using a commercially available two-frequency parallel flat plate plasma etching apparatus (frequencies: 60 MHz and 2 MHz) under conditions that the reaction chamber was maintained at a pressure of 4 Pa (30 mTorr), and RF power of 1200 W/200 W was applied:

(Sample 1) Components: $CHF_3/Ar/O_2/C_4F_8$
   Flow Rate: X/600/15/Y (unit: sccm)
(Sample 2) Components: $CH_2F_2/Ar/O_2/C_4F_8$
   Flow Rate: X/600/15/Y (unit: sccm)
(Sample 3) Components: $CHF_3/Ar/O_2/C_5F_8$
   Flow Rate: X/600/15/Y (unit: sccm)

Then, the etching rate on bottom 21 of hole 20 and the etching rate at shoulder 22 were measured under the respective etching conditions to calculate the ratio of the rate on the bottom (bottom rate) to the rate at the shoulder (shoulder rate) for each sample. Further, dependency of the bottom rate/shoulder rate on the X/Y ratio was examined under each etching condition to find an optimal X/Y ratio.

Figure 5A:
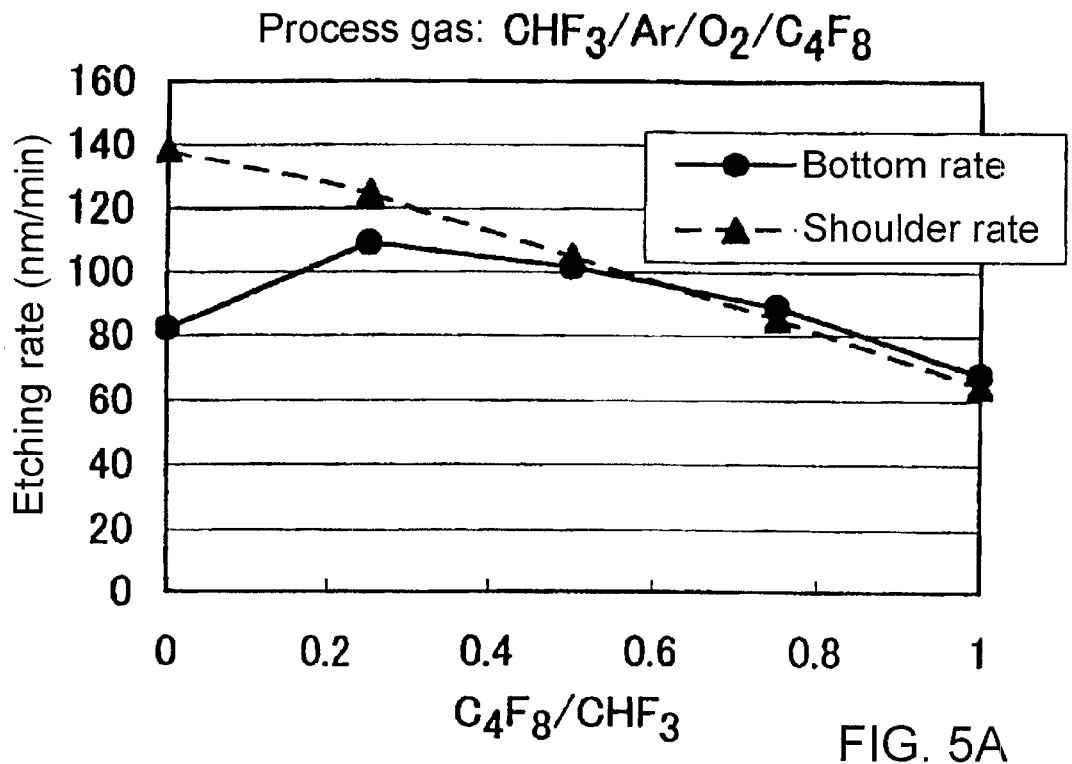
FIGS. 5A to 5D are graphs for explaining the relationship between an etching rate on the bottom and an etching rate at a shoulder when $CHF_3/Ar/O_2/C_4F_8$ is used as a gas system.
Figure 5B:
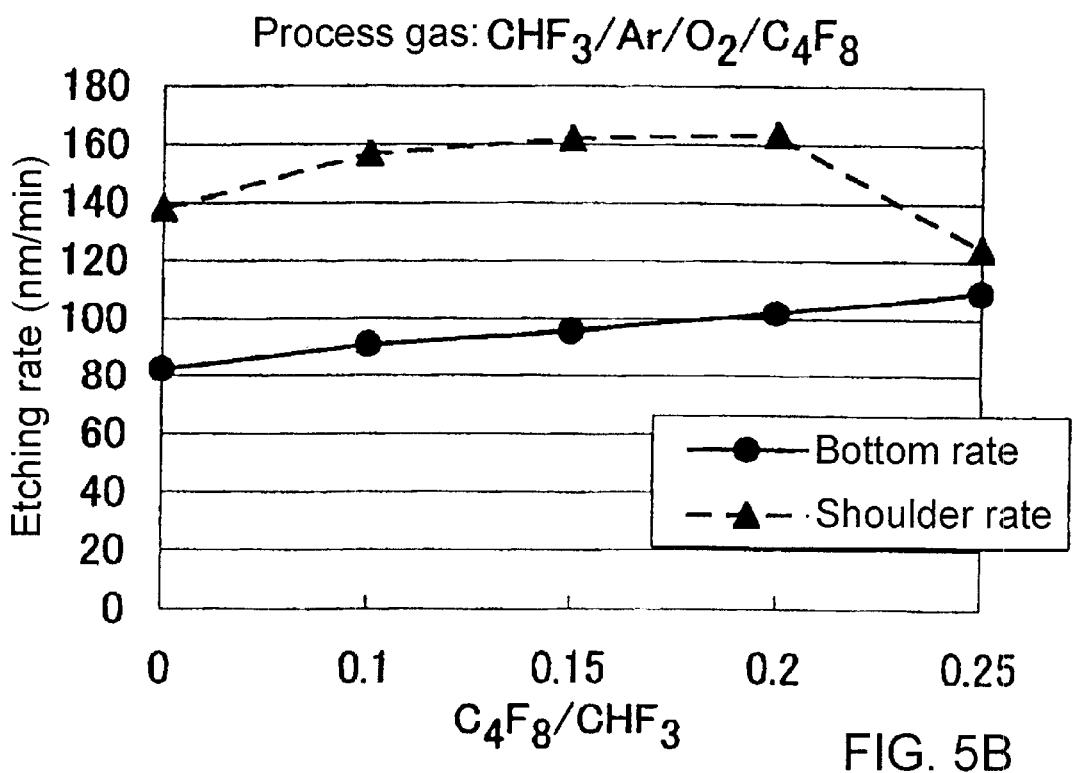
Figure 5C:
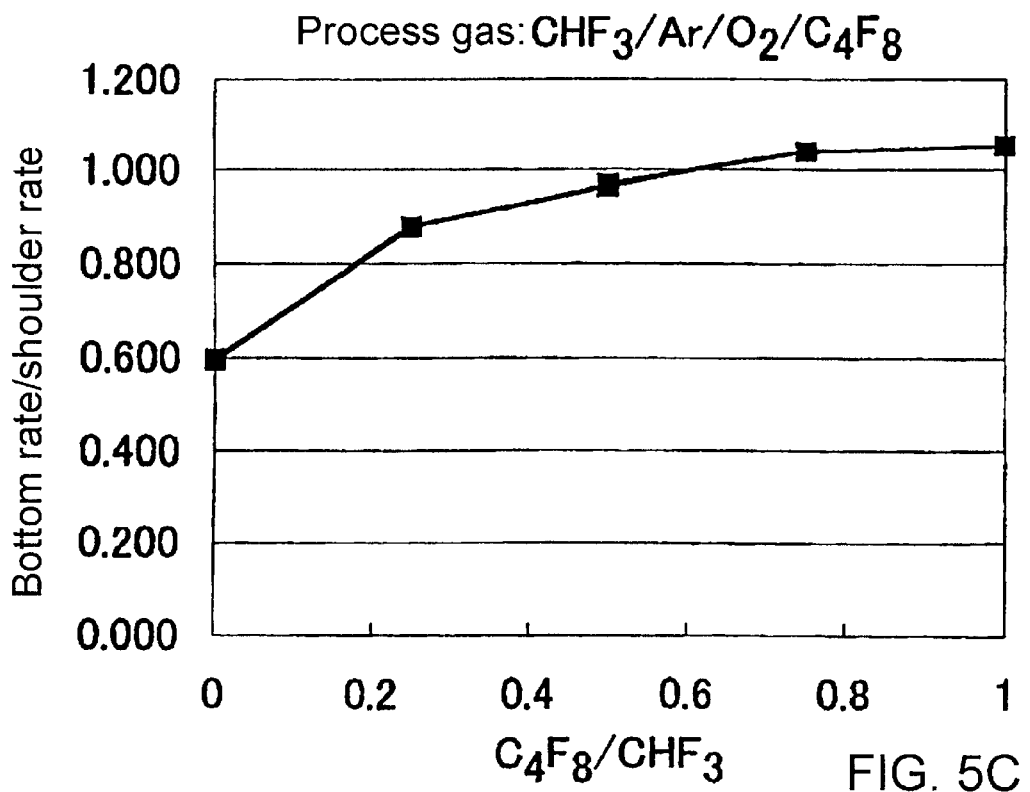
Figure 5D:
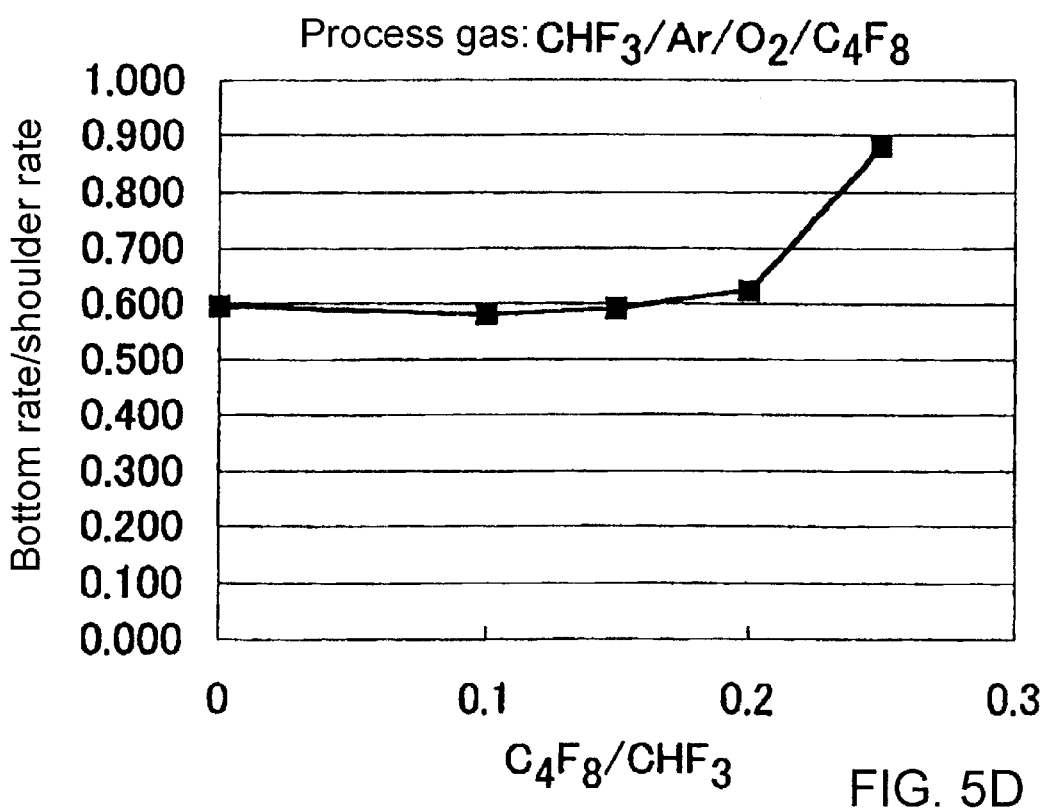
Figure 6A:
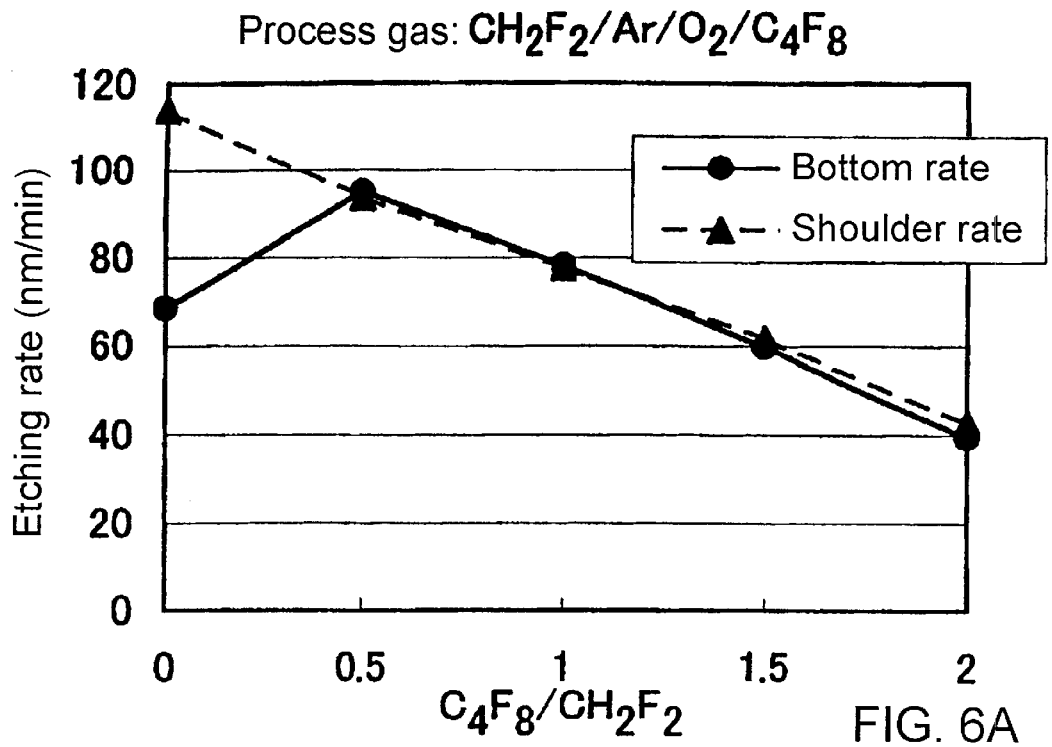
FIGS. 6A to 6D are graphs for explaining the relationship between an etching rate on the bottom and an etching rate at a shoulder when $CH_2F_2/Ar/O_2/C_4F_8$ is used as a gas system.
Figure 6B:
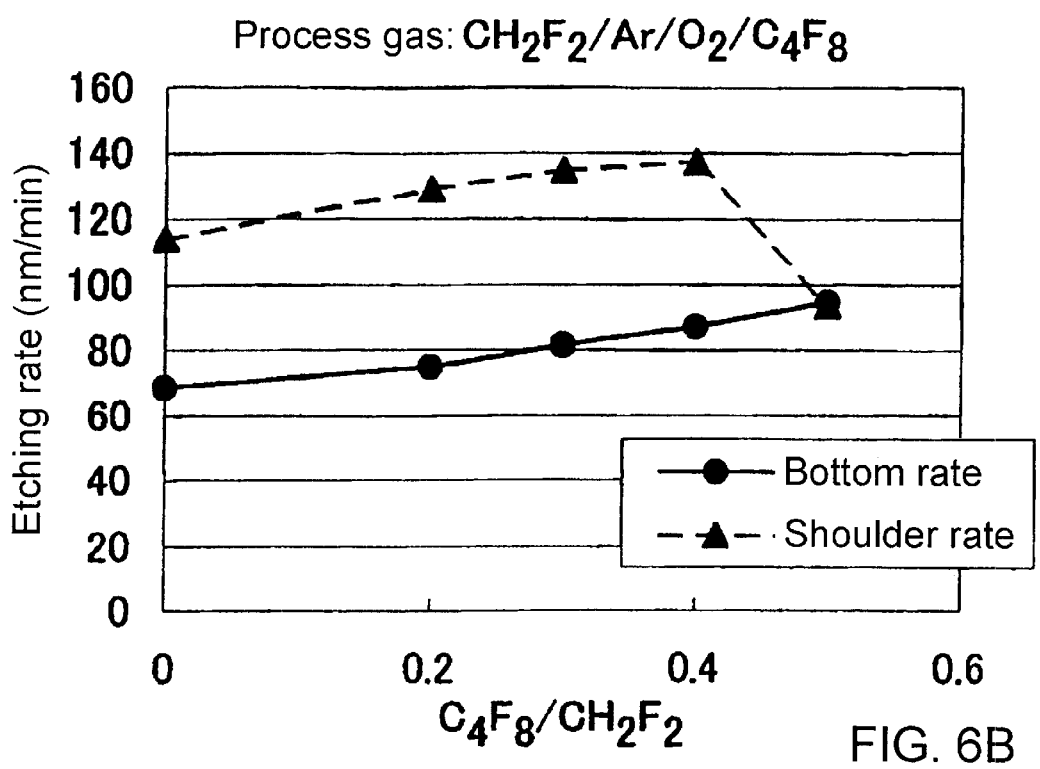
Figure 6C:
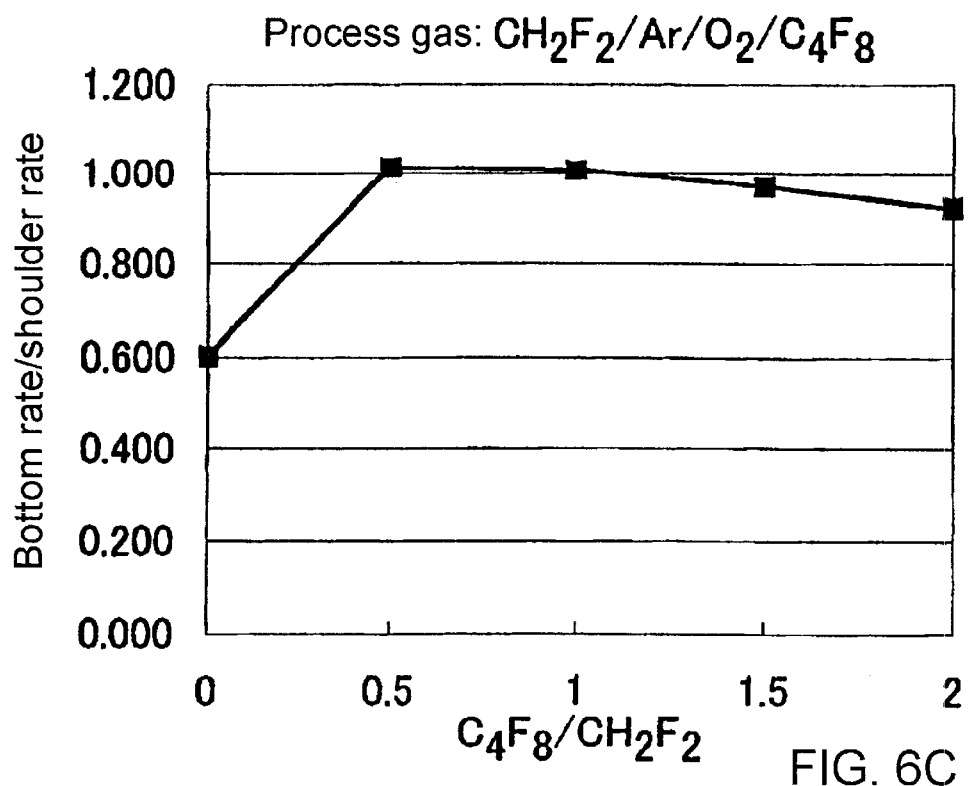
Figure 6D:
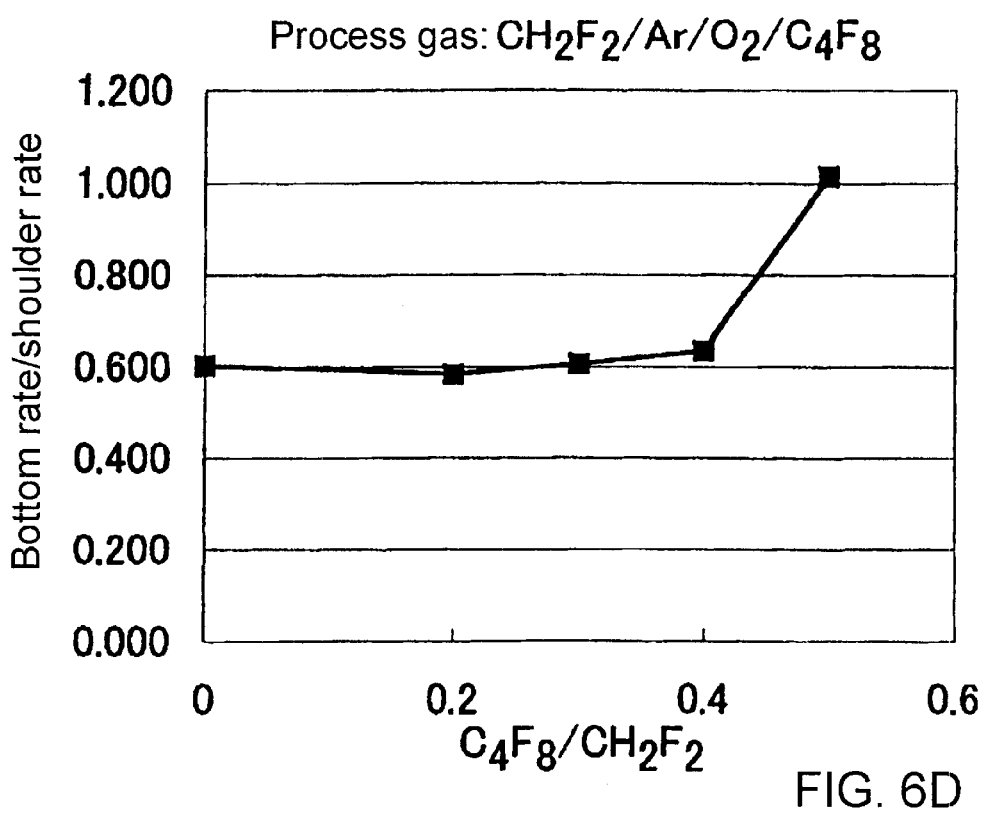
Figure 7A:
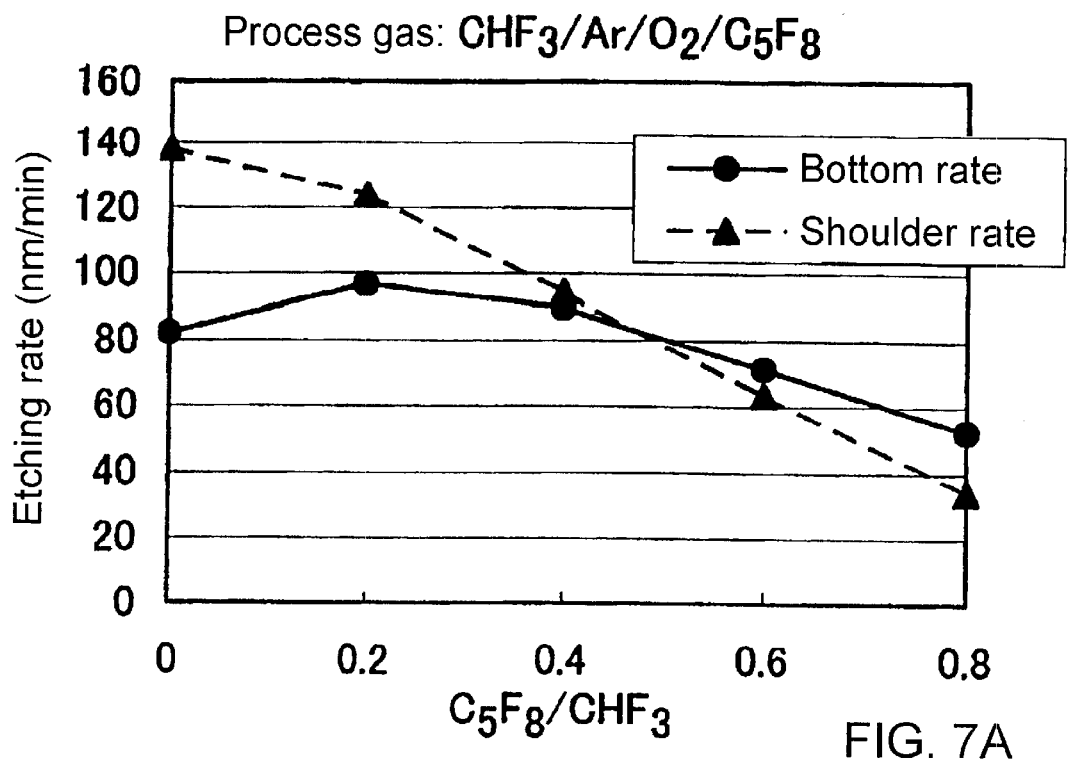
FIGS. 7A to 7D are graphs for explaining the relationship between an etching rate on the bottom and an etching rate at a shoulder when $CHF_3/Ar/O_2/C_5F_8$ is used as a gas system.
Figure 7B:
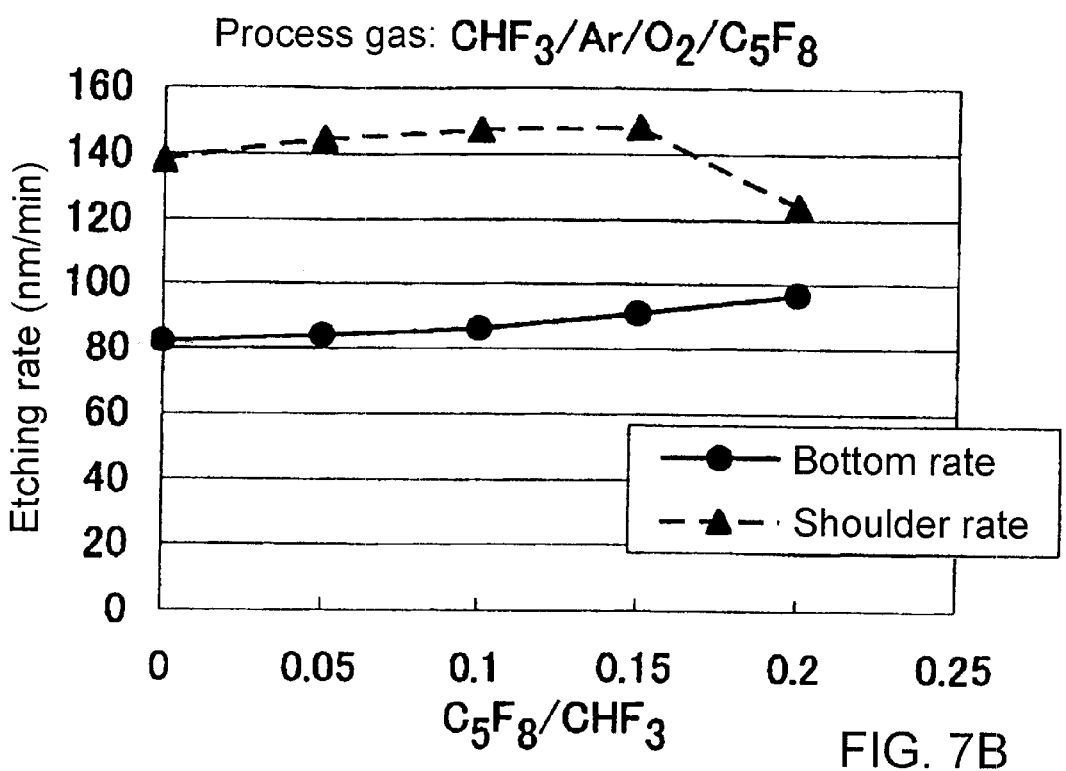
Figure 7C:
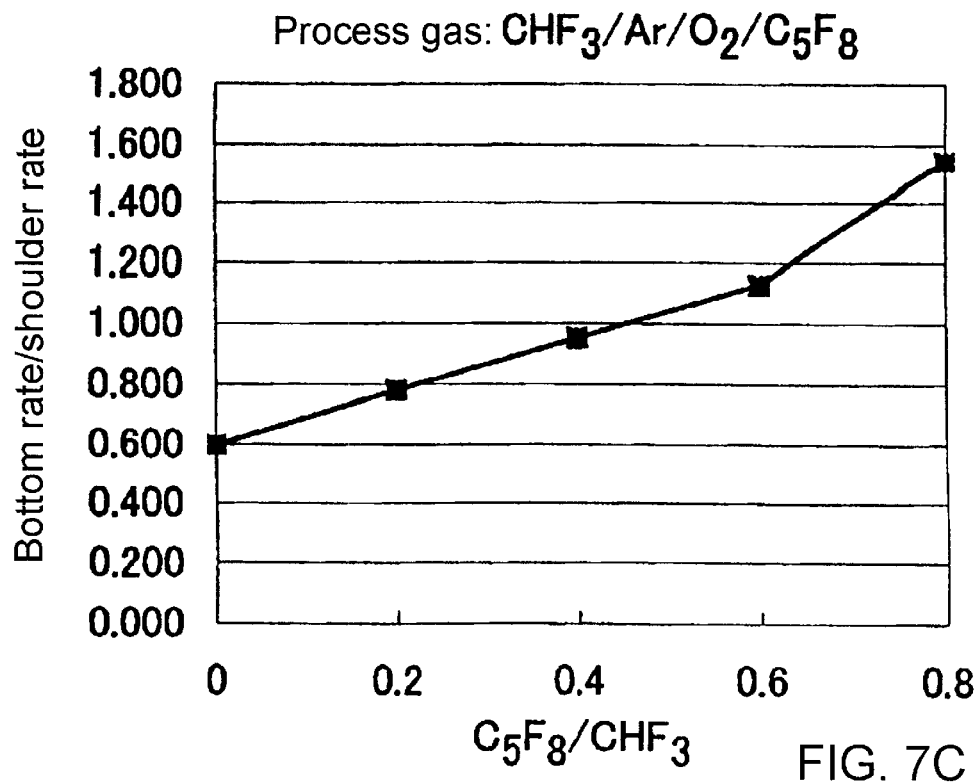
Figure 7D:
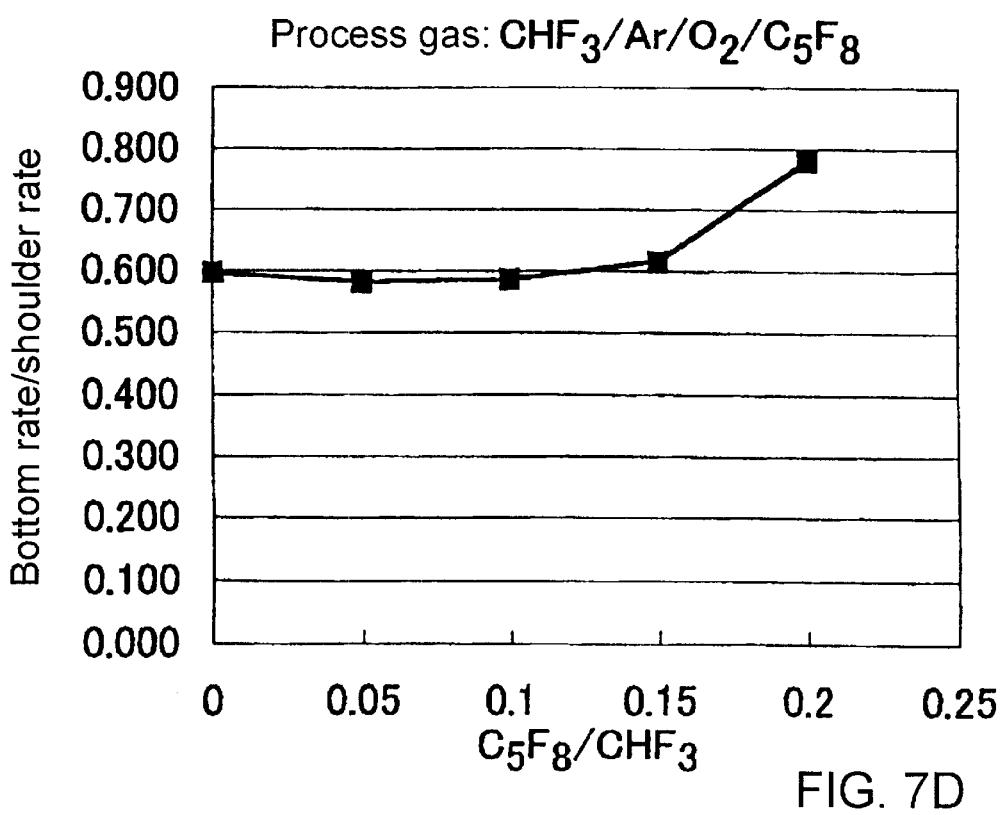

FIGS. 5A to 5D show the results on Sample 1; FIGS. 6A to 6D show the results on Sample 2; and FIGS. 7A to 7D show the results on Sample 3. Here, X corresponds to a mole flow rate of a lower-order fluorocarbon, that is, second fluorine compound, while Y corresponds to a mole flow rate of a higher-order fluorocarbon, that is first fluorine compound. In these graphs, FIGS. 5A, 6A and 7A show the etching rates on the bottom and at the shoulder; FIGS. 5B, 6B and 7B show the etching rates at the bottom and at the shoulder in a region where the proportion of the higher order fluorocarbons is small; FIGS. 5C, 6C and 7C show the bottom rate/shoulder rate; and FIGS. 5D, 6D and 7D show the bottom rate/shoulder rate in a region where the proportion of the higher order fluorocarbons is small. In either of the graphs, the horizontal axis represents Y/X.

As can be seen from FIGS. 5A to 5D, with the process gas comprised of $CHF_3/Ar/O_2/C_4F_8$, the etching rate at the shoulder is reduced as a $C_4F_8/CHF_3$ flow ratio is higher. It seems that this is because deposition produced from $C_4F_8$ protects the silicon nitride film from the etching gas. When a small amount of $C_4F_8$ was added, the etching rate on the bottom slightly increases. It seems that this is because lower-order fluorocarbons produced from $C_4F_8$, on the contrary, promote the etching of the silicon nitride film on the bottom of the hole to which the deposition is difficult to access. The etching rate on the bottom exhibits the highest value when the $C_4F_8/CHF_3$ flow ratio (mole ratio) is 0.25, and subsequently becomes lower together with the etching rate at the shoulder. Further, it was found through an observation that the etching was not advanced partially on the bottom of the hole in a region of $C_4F_8/CHF_3>1$ (etching stop state). In FIGS. 5A to 5D, a point on the horizontal axis indicating the $C_4F_8/CHF_3$ flow ratio equal to 0.25 corresponds to $R_1/R_2=1$ in Equation (1), and a point indicating the flow ratio equal to 1.0 corresponds to $R_1/R_2=4$.

A similar tendency was found also in the process gas comprised of $CH_2F_2/Ar/O_2/C_4F_8$ shown in FIGS. 6A to 6D, and the process gas comprised of $CHF_3/Ar/O_2/C_5F_8$ shown in FIGS. 7A to 7D. In FIGS. 6A to 6D, a point on the horizontal axis indicating the $C_4F_8/CH_2F_2$ flow ratio equal to 0.5 corresponds to $R_1/R_2=1$ in Equation (1), and a point indicating the flow ratio equal to 2.0 corresponds to $R_1/R_2=4$. In FIGS. 7A to 7D, a point on the horizontal axis indicating the $C_5F_8/CHF_3$ flow ratio equal to 0.2 corresponds to $R_1/R_2=1$ in Equation (1), and a point indicating the flow ratio equal to 0.8 corresponds to $R_1/R_2$32 4.

In conclusion, irrespective of the type of lower-order fluorocarbons or higher-order fluorocarbons, when higher-order fluorocarbons are not at all included, i.e., when only lower-order fluorocarbons are included as a fluorine compound, the etching rate at the shoulder is significantly higher than the etching rate at the bottom, causing prominent side etching as described in the background art. As more higher-order fluorocarbons are added, the etching rate at the shoulder consistently decreases. On the other hand, the etching rate on the bottom once increases to substantially the same as the etching rate at the shoulder, and subsequently decreases in a manner similar to the etching rate at the shoulder.

As a result, it was found that conditions that the etching rate at the shoulder is substantially equal to the etching rate at the bottom, and the etching stop state is avoided, are expressed by:

$$1 \leq R_1/R_2 \leq 4$$

where $R_1$ is the sum of $m_1 \times n_{C-C}$ calculated for the respective chemical species included in the higher-order fluorocarbons; $R_2$ is the sum of $m_2 \times n_{C-H}$ calculated for the respective chemical species included in the lower-order fluorocarbons; $n_{C-C}$ is the number of carbon atom-carbon atom bonds included in one molecule of each chemical species of the higher-order fluorocarbons; $m_1$ is a mole fraction of each chemical species of the higher-order fluorocarbons in the supplied process gas; $n_{C-H}$ is the number of carbon atom-hydrogen atom bonds included in one molecule of each chemical species of the lower-order fluorocarbons; and $m_2$ is a mole fraction of each chemical species of the lower-order fluorocarbons.

EXAMPLE 2

Exemplary Application to Real Device

Figure 8:
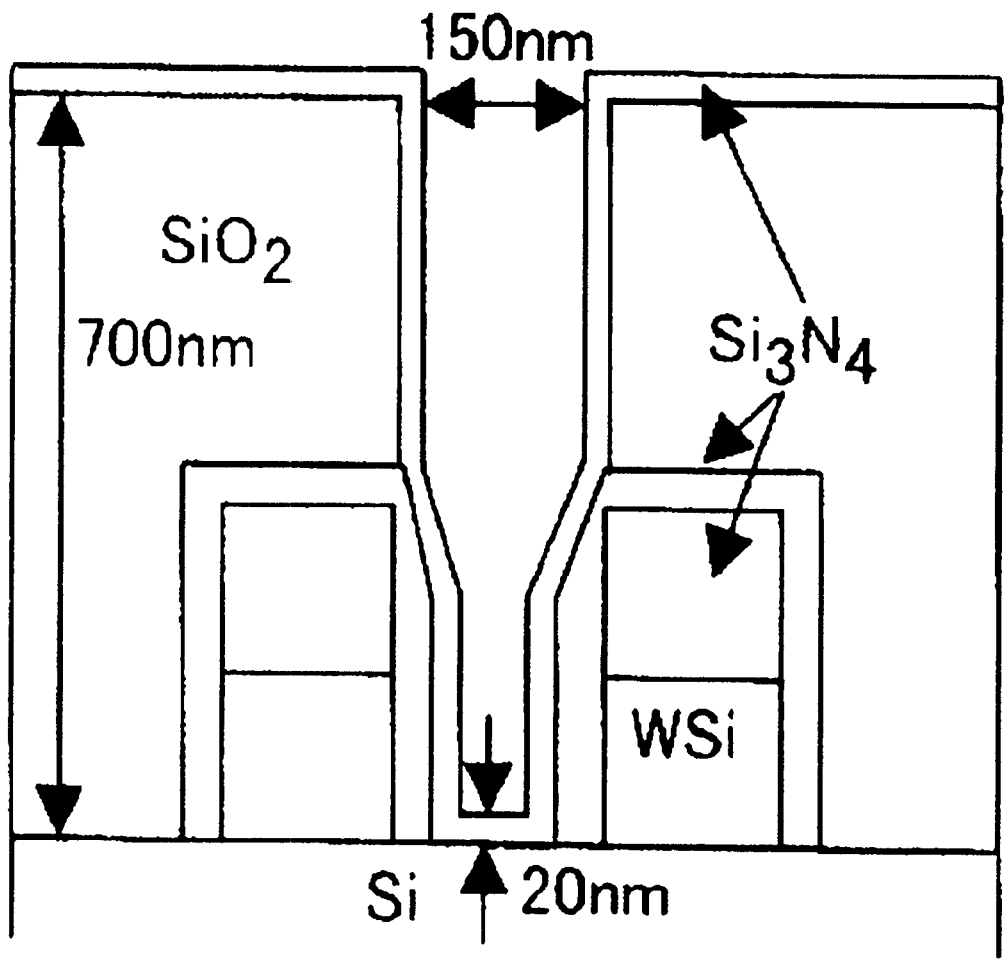
FIG. 8 is a schematic cross-sectional view illustrating the structure of a device in Example 2.

The method of the present invention was applied to a real device manufactured by an SAC process. Here, a real device was fabricated in dimensions shown in FIG. 8, and a silicon nitride film was removed from the bottom of a contact hole (the aspect ratio of which is 4.7) in this real device. Using a commercially available two-frequency parallel flat plate plasma etching apparatus (frequencies: 60 MHz and 2 MHz) under conditions that the reaction chamber was maintained at a pressure of 4 Pa (30 mTorr), and RF power of 1200 W/200 W was applied, $CHF_3/Ar/O_2/C_4F_8$ was used as a process gas, and their flow rates were chosen to be 15 sccm/600 sccm/15 sccm/15 sccm. Then, the amount of etched silicon nitride at a shoulder was measured in the event of 30% overetching. As a result, the amount of etched shoulder was 23 nm. Assuming that the etching rate at the shoulder was equal to the etching rate at the bottom, the amount of etched silicon nitride film at the shoulder should be 26 nm, so that it was found from the etching rate measured in this example that the etching rate was higher on the bottom than at the shoulder.

EXAMPLE 3

Exemplary Application to Real Device

Figure 9:
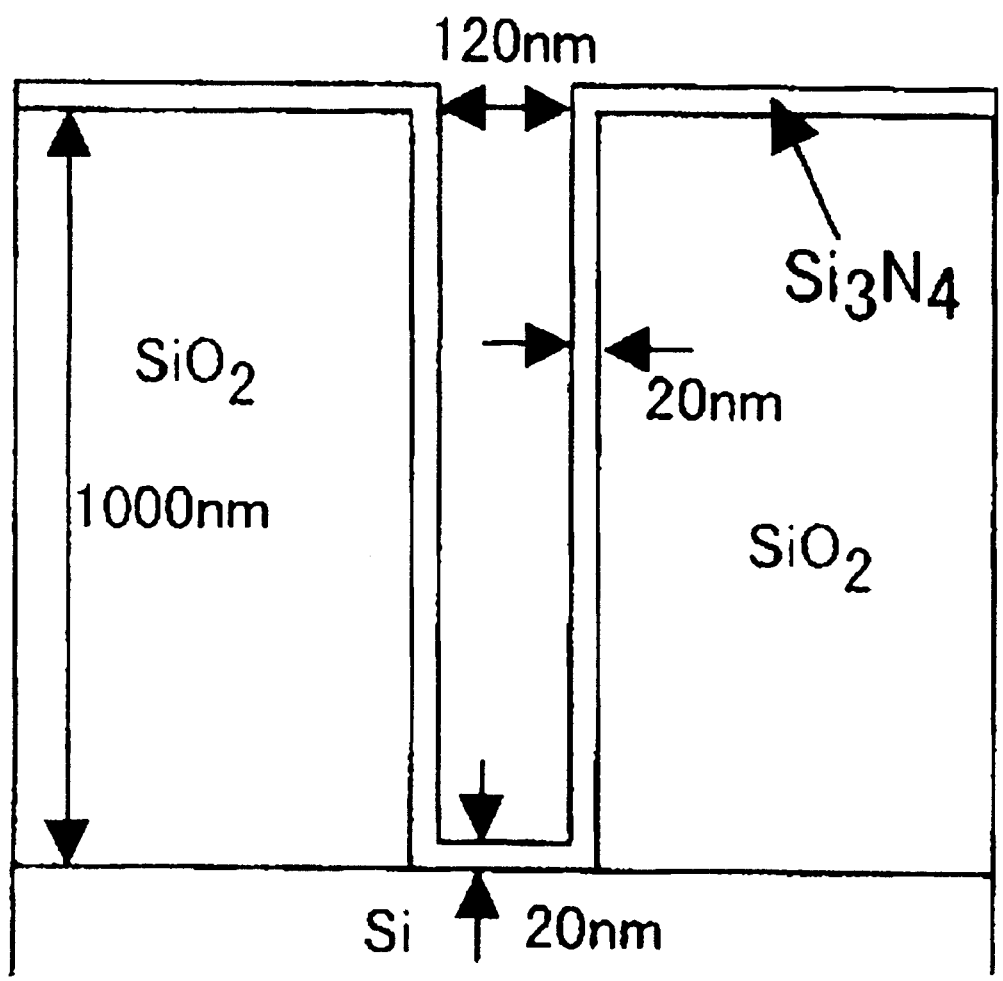
FIG. 9 is a schematic cross-sectional view illustrating the structure of a device in Example 3.

The method of the present invention was applied to a real device having a miniature contact hole. Here, a real device was fabricated in dimensions shown in FIG. 9, and a silicon nitride film was removed from the bottom of a contact hole (the aspect ratio of which is 8.7) in the real device. Using a commercially available two-frequency parallel flat plate plasma etching apparatus (frequencies: 60 MHz and 2 MHz) under conditions that the reaction chamber was maintained at a pressure of 4 Pa (30 mTorr), and RF power of 1200 W/200 W was applied, $CHF_3/Ar/O_2/C_4F_8$ was used as a process gas, and their flow rates were chosen to be 15 sccm/600 sccm/15 sccm/15 sccm. Then, the amount of etched silicon nitride on a side wall of the contact hole was measured in the event of 30% overetching. As a result, the silicon nitride film on the bottom of the hole was completely etched away in the 30% overetching, and the amount of etched side wall was 0 nm in that event, thus eliminating side wall etching. Actually, an emission spectrometer was used to monitor light at wavelength of 388 nm, and a just etching time was defined at a point at which the waveform was completely stabilized. Even at this just etching time, the silicon nitride film was completely etched on the bottom of the hole.

While preferred embodiments of the present invention have been described using specific terms, such description is for illustrative purposes only, and it is to be understood that changes and variations may be made without departing from the spirit or scope of the appended claims.

What is claimed is:

1. A method of removing a silicon nitride film formed on a surface of a material, comprising the steps of:
   supplying a process gas which comprises a first fluorine compound including a carbon atom-carbon atom bond, and a second fluorine compound including at least one hydrogen atom and a single carbon atom in one molecule; and
   performing dry etching using said process gas to remove said silicon nitride film from the bottom of a contact hole without removing said silicon nitride film from the side walls of said contact hole.

2. The method according to claim 1, wherein said first fluorine compound is selected from the group consisting of octafluorocyclobutane ($C_4F_8$), hexafluorobutadiene ($C_4F_6$), and octafluorocyclopentene ($C_5F_8$).

3. The method according to claim 1, wherein said dry etching is plasma etching.

4. The method according to claim 1, wherein said second fluorine compound is at least one of monofluoromethane ($CH_3F$), difluoromethane ($CH_2F_2$), and trifluoromethane ($CHF_3$).

5. The method according to claim 2, wherein said second fluorine compound is at least one of monofluoromethane ($CH_3F$), difluoromethane ($CH_2F_2$), and trifluoromethane ($CHF_3$).

6. The method according to claim 5, wherein said dry etching is plasma etching.

7. The method according to claim 1, wherein the following relationship is satisfied:

$$1 \leq R_1/R_2 \leq 4$$

where $R_1$ is the sum of $m_1 \times n_{C-C}$ calculated for said respective first fluorine compound;

$R_2$ is the sum of $m_2 \times n_{C-H}$ calculated for said respective second fluorine compound;

$n_{C-C}$ is the number of carbon atom-carbon atom bonds included in one molecule of said first fluorine compound;

$m_1$ is the mole fraction of said first fluorine compound in said supplied process gas;

$n_{C-H}$ is the number of carbon atom-hydrogen atom bonds included in one molecule of said second fluorine compound; and $m_2$ is the mole fraction of said second fluorine compound in said supplied process gas.

8. The method according to claim 5, wherein the following relationship is satisfied:

$$1 \leq R_1/R_2 \leq 4$$

where $R_1$ is the sum of $m_1 \times n_{C-C}$ calculated for said respective first fluorine compounds;

$R_2$ is the sum of $m_2 \times n_{C-H}$ calculated for said respective second fluorine compounds;

$n_{C-C}$ is the number of carbon atom-carbon atom bonds included in one molecule of each said first fluorine compound;

$m_1$ is the mole fraction of each said first fluorine compound in said supplied process gas;

$n_{C-H}$ is the number of carbon atom-hydrogen atom bonds included in one molecule of each said second fluorine compound; and $m_2$ is the mole fraction of each said second fluorine compound in said supplied process gas.

9. The method according to claim 6, wherein said surface of the material is a bottom of a contact hole formed in a semiconductor device.

10. The method according to claim 6, wherein said surface of the material is a bottom of a hole having an aspect ratio in a range of three to ten.

* * * * *